United States Patent [19]
Mamada

[11] Patent Number: 5,701,353

[45] Date of Patent: Dec. 23, 1997

[54] AUDIO SIGNAL PROCESSING CIRCUIT FOR COMPRESSING OR EXPANDING AUDIO SIGNAL IN WHICH OUTPUT DC VOLTAGE IS CONTROLLED IN RESPONSE TO REFERENCE VOLTAGE

[75] Inventor: Takao Mamada, Ota, Japan

[73] Assignee: Sanyo Electronic Co., Ltd., Moriguchi, Japan

[21] Appl. No.: 658,575

[22] Filed: Jun. 5, 1996

[30] Foreign Application Priority Data

Jun. 12, 1995 [JP] Japan .................. HEI 7-144735
Jun. 12, 1995 [JP] Japan .................. HEI 7-144736

[51] Int. Cl.[6] .................................................. H03G 7/00
[52] U.S. Cl. ........................................ 381/106; 381/120
[58] Field of Search .......................... 381/106, 104–109, 381/58, 120

[56] References Cited

U.S. PATENT DOCUMENTS

| | | | |
|---|---|---|---|
| 4,061,891 | 12/1977 | Pommer | 381/58 |
| 5,394,474 | 2/1995 | Hirai et al. | 381/106 |
| 5,402,498 | 3/1995 | Waller, Jr. | 381/106 |

*Primary Examiner*—Curtis Kuntz
*Assistant Examiner*—Vivian Chang
*Attorney, Agent, or Firm*—Armstrong, Westerman, Hattori, McLeland & Naughton

[57] ABSTRACT

A DC voltage comparator is provided on the input side of an amplifier of an electric current controlled type. The DC voltage comparator compares the DC voltage on the input side of the amplifier and a reference voltage. Some electric currents are drawn and fed in response to the result of comparison with respect to the input and output sides of the amplifier, thereby controlling the output of the amplifier.

12 Claims, 7 Drawing Sheets

1

AUDIO SIGNAL PROCESSING CIRCUIT FOR COMPRESSING OR EXPANDING AUDIO SIGNAL IN WHICH OUTPUT DC VOLTAGE IS CONTROLLED IN RESPONSE TO REFERENCE VOLTAGE

BACKGROUND OF THE INVENTION

1. Field of the Invention

The present invention relates to an audio signal processing circuit in a home-use video cassette recorder (VCR) which records and reproduces an audio signal, and, in particular, to an audio signal processing circuit in which an output DC voltage of an operational amplifier is adjusted to be a desired value, the operational amplifier compressing or expanding an audio signal for recording or reproducing the audio signal.

2. Description of the Prior Art

In a home-use VCR which records and reproduces an audio signal in high quality, an audio signal processing circuit compresses and expands the audio signal when recording and reproducing the audio signal, respectively.

FIG. 1 shows the characteristic of input/output audio signals in recording and reproducing operations. As is indicated in the drawing, for instance, when an audio signal is input at a level of −20 dB, it is then output at −10 dB for recording. On the other hand, when it is input at −10 dB, it is then output at −20 dB for reproduction. When such compression/expression is executed for an audio signal, the signal can acquire a favorable signal to noise ratio (S/N).

FIG. 2 shows an audio signal recording device which compresses an audio signal. When an audio signal is supplied via an input terminal 1, it is subjected to level adjustment in an automatic level controlling (ALC) circuit 2, and further applied to a non-inverting input terminal of a first operational amplifier 3.

The output of the first operational amplifier 3 is applied to a control circuit 5 as well as to a second operational amplifier 4. The control circuit 5 comprises a waiting circuit 6, a detection circuit 7 and a voltage/current (V/I) conversion circuit 8, and controls the gain of the second operational amplifier 4. The waiting circuit 6 includes a filter which enhances a signal having a frequency around 10 KHz. In the control circuit 5, the input signal first passes through the waiting circuit 6, and proceeds to a detection circuit 7, where the voltage level of the signal is detected through full-wave rectification. The signal is then converted into an electric current in the voltage/current conversion circuit 8, and supplied to the second operational amplifier 4.

The second operational amplifier 4 is an electric current controlled amplifier whose gain is controlled by electric current. The gain of the amplifier 4 is controlled by the signal supplied by the voltage/current conversion circuit 8.

The output of the first operational amplifier 3 is applied, via resistors R1, R2 and R3, to input terminals of a second operational amplifier 4, as described above, and amplified therein. In this event, the output of the amplifier 3 branches at the input side of the amplifier 4 so that one of the branched flows is applied to and charges a capacitor 2 via the resistors R1 and R2. The capacitor C2, which has a large capacitance, smooths the supplied output so as to bias the input and output of the first operational amplifier 3.

Another capacitor C1 and resistors R4 and R5 together constitute a noise reduction emphasis circuit which reduces a high frequency area in an output of the second operational amplifier 4.

2

The capacitor C2 and the resistor R2 constitute a smoothing circuit, which adjusts the DC voltage at the inverting terminal of the second operational amplifier 4 so as to correspond to the DC voltage of the output of the first operational amplifier 3. Terminals 9 and 10 are terminals on an integrated circuit when the circuit is formed into the integrated circuit. The control circuit 5 controls the second operational amplifier 4 such that an output signal of the first operational amplifier 3 which has a larger voltage level will cause a larger gain of the second operational amplifier 4. Further, when the voltage level of an output signal of the second operational amplifier 4 is increased, the voltage level of the signal to be fed back to the inverting terminal of the first operational amplifier is also increased, so that the voltage level of an output signal of the first operational amplifier 3 is accordingly decreased.

In this way, as the voltage level of an output signal of the first operational amplifier 3 becomes larger, the voltage level of a feedback signal is also increased, so that the voltage level of the output signal of the second operational amplifier 3 is decreased. Therefore, compression of the signal as shown in FIG. 1 is accomplished.

Meanwhile, the output signal of the first operational amplifier 3 is also applied to an emphasis circuit 13, where it is subjected to an emphasizing process with a predetermined characteristic. The processed signal is then applied to a DC blocking capacitor 14 to remove its DC component, and further transmitted to a modulation circuit 15.

In the modulation circuit 15, the voltage level of the input signal and the reference voltage are compared so that the electric current corresponding to the voltage difference is applied to a voltage controlled oscillator (VCO) 16 for varying the oscillation frequency thereof. The modulation circuit 15 and the VCO 16 together constitute an FM modulator. Thus, the signal is subjected to FM modulation while passing through the FM modulator, whereby an FM modulated signal is output from the output terminal 17.

As described above, according to the audio signal processing circuit in FIG. 2, an audio signal is compressed so as to be eventually output as an FM modulated signal. Using this output, it is possible to record a compressed audio signal on a VCR tape through FM recording.

The second operational amplifier 4 in FIG. 2 has a structure for outputting amplified electric current so as to ensure a larger input dynamic range.

With the thus constituted second operational amplifier 4, however, it is impossible to obtain an output DC voltage of the second operational amplifier 4 which is precisely defined at a desired level, due to the variation in value of the elements within the internal circuit of the second operational amplifier 4.

FIG. 3 shows the final stage of the circuit for outputting electric current within the second operational amplifier 4. Two flows of electric current, which have opposite phases to each other, flow into terminals 18 and 19, respectively, and are further transmitted, via respective current mirrors CM1 and CM2, to an output terminal 20. The two flows are coupled at the terminal 20 so that a signal corresponding to the voltage difference of the two flows is output therefrom.

Here, if there should be the slightest difference in a DC voltage level between the two current flows, a signal output from the terminal 20 reflects that voltage difference. Referring to FIG. 2 again, this signal, which has a voltage corresponding to the voltage difference, is fed back to the first operational amplifier 3. As a result of this feedback, the DC voltage of the output of the emphasis circuit 13 is varied (offset).

When the offset in the output of the emphasis circuit 13 is transmitted to the subsequent modulation circuit 15, a frequency modulation range thereof will be unbalanced. In order to prevent the modulation range from being unbalanced, it is necessary to provide a DC blocking capacitor 14 between the emphasis circuit 13 and the modulation circuit 15.

However, provision of a DC blocking capacitor 14 will result in an increase of the number of components and an increase in cost. Further, when the entire circuit is formed into an integrated circuit, the DC blocking capacitor 14 must be attached externally, which will require a greater number of pins (connectors).

Therefore, it has been desired to eliminate a DC blocking capacitor from the circuit.

FIG. 4 shows a conventional signal processing circuit which reproduces an audio signal by expanding the audio signal. An FM demodulated audio signal is first supplied via an input terminal 1, and then transmitted to the non-inverting terminal of the first operational amplifier 3. An output of the first operational amplifier 3 is directly fed back to the inverting terminal of the first operational amplifier 3 so that the first operational amplifier 3 acts as a buffer amplifier. An output of the first operational amplifier 3 is now supplied to the second operational amplifier 4, so that the output signal of the amplifier 4 is further output, via the line amplifier 18, from the output terminal 19.

The remaining construction of the circuit in FIG. 4 is the same as those of the circuit in FIG. 2. For instance, an output of the first operational amplifier 3 is also supplied to the control circuit 5. The control circuit 5 controls the gain of the second operational amplifier 4 in response to the output of the first operational amplifier 3 such that an output signal of the first operational amplifier 3 which has a larger voltage level will cause a larger gain of the second operational amplifier 4. That is, as a demodulated signal having a larger voltage level is supplied via the input terminal 1, the gain of the second operational amplifier 2 becomes larger, so that a signal which has been amplified by a larger gain is output via the line amplifier 18. In other words, as shown in FIG. 2, when the voltage level of an input signal becomes larger, an output signal which has been amplified by a larger amplification rate can be obtained. Thus, a compressed signal is expanded as described above, which makes it possible to reproduce an audio signal before compression, that is, recording.

However, even with this arrangement, the second operational amplifier 4 has the same construction as that in FIG. 3, which therefore has the same problem as described above. That is, a DC level of an output of such an amplifier is varied. When a DC level is varied, the DC voltage level at the input terminal of the line amplifier 18 is accordingly varied (offset), which resultantly narrows the dynamic range of the line amplifier 18.

It has thus been desired to have a DC level, in an output of the second operational amplifier in an audio signal reproduction circuit, controlled to a predetermined value.

SUMMARY OF THE INVENTION

The present invention aims to provide an audio signal processing circuit in which the level of a DC voltage of an output of the first operational amplifier is held at a predetermined value when recording an audio signal.

The present invention further aims to provide an audio signal processing circuit in which the level of a DC voltage of an output of the second operational amplifier is held at a predetermined value when reproducing an audio signal.

According to the audio signal recording device of the present invention, the DC control circuit adjusts the output voltage of the first operational amplifier to be constantly equal to a reference voltage. Thus, the DC level (average voltage) of a compressed signal becomes equal to the reference voltage, which resultantly eliminates the need for a DC block capacitor.

In particular, when the second operational amplifier is an amplifier for outputting amplified electric current, it is likely to cause an offset voltage in its output electric current. However, the present invention can solve this offset problem because the DC voltage on the output side of the first operational amplifier is adjusted to be equal to a reference voltage through employment of a comparator which detects a voltage difference between the DC component of an input of the second operational amplifier and a reference voltage so that the voltages at the output terminals of the first and second operational amplifiers are controlled accordingly. In particular, since the comparator outputs electric current, it can regulate an offset of the second operational amplifier, which is also of a type for outputting amplified electric current, as desired.

According to the audio signal reproduction device of the present invention, the DC control circuit adjusts the output voltage of the second operational amplifier to be constantly equal to the reference voltage, so that an appropriately expanded signal is always obtained. Further, the dynamic range of a line amplifier, which amplifies an expanded signal, can be prevented from being narrowed. The comparator for an audio signal reproduction device has substantially the same construction as that for an audio signal recording device.

BRIEF DESCRIPTION OF THE DRAWINGS

The above and the other objects, features and advantages will be apparent from the following description of the preferred embodiment taken in conjunction with the accompanying drawings wherein.

DESCRIPTION OF THE PREFERRED EMBODIMENTS

Embodiment 1

Figure 1:
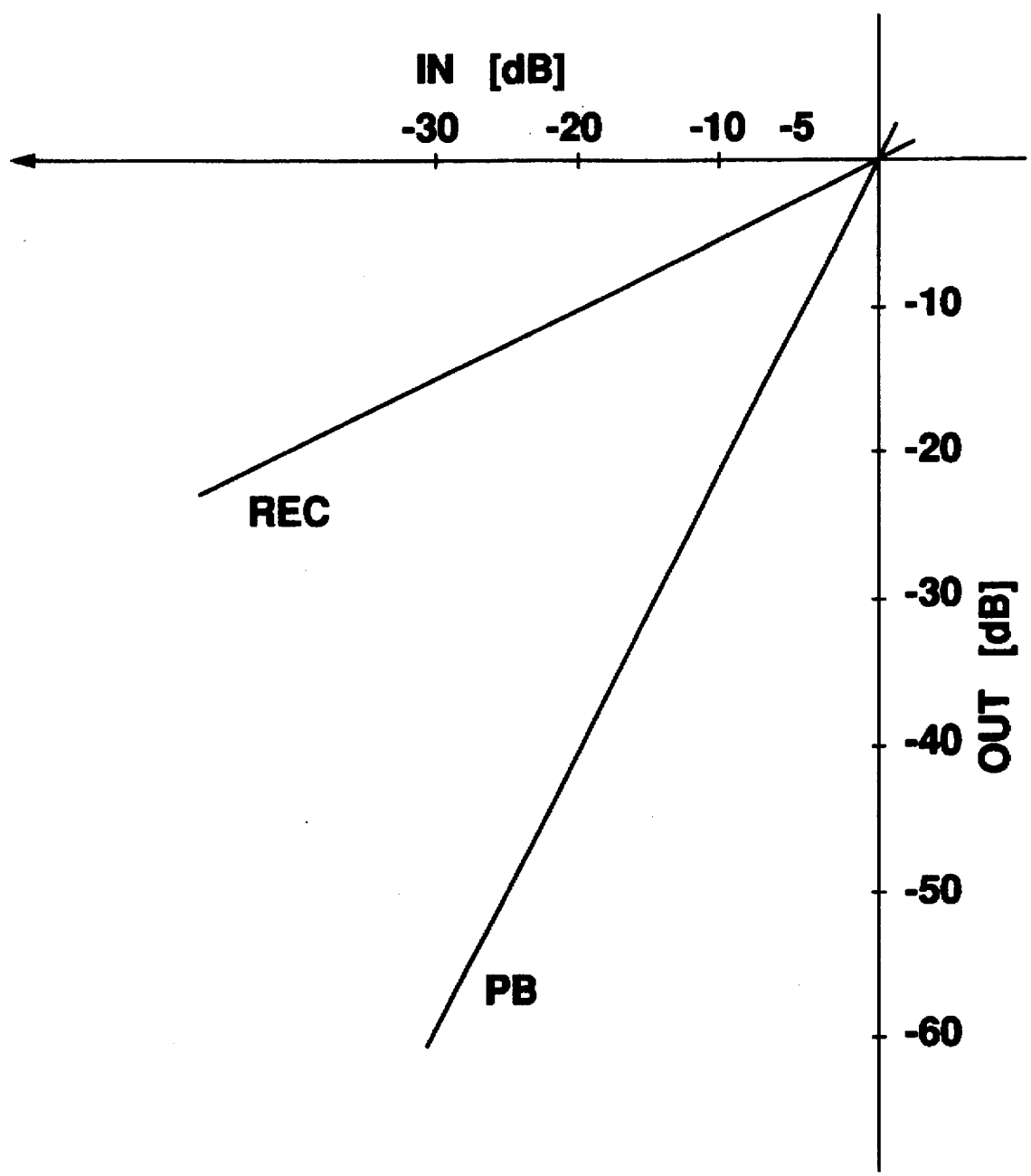
FIG. 1 shows the characteristic of input/output audio signals in recording and reproducing operations.
Figure 2:
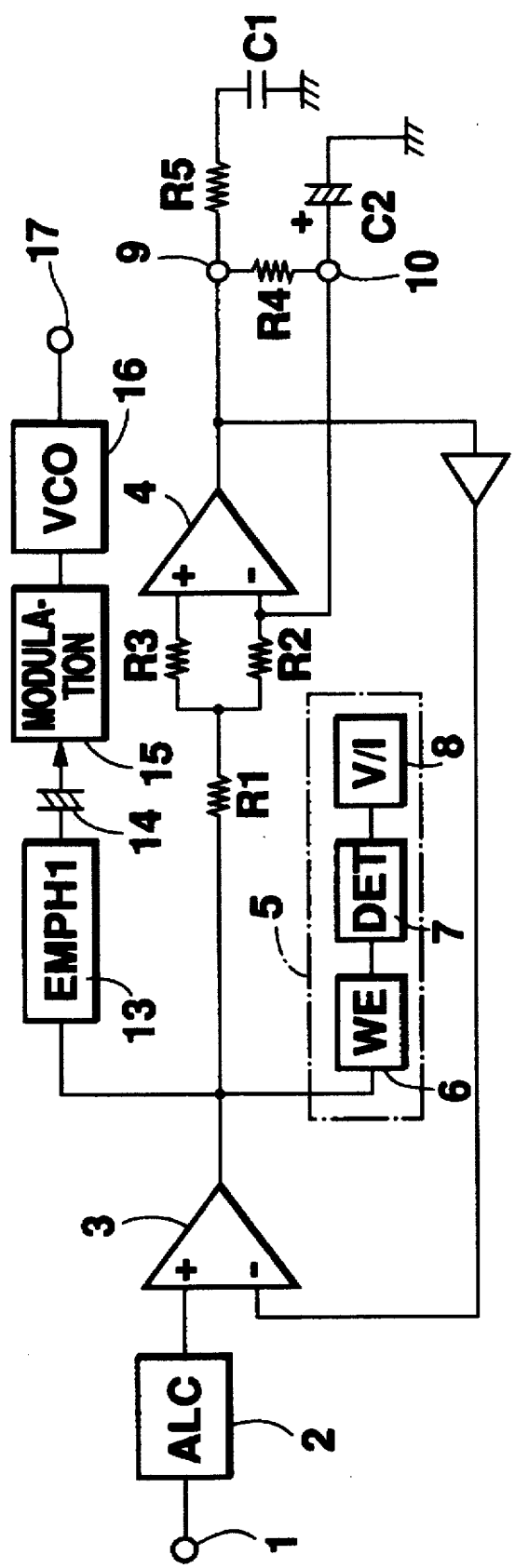
FIG. 2 shows a circuit structure of a conventional audio signal recording device which compresses an audio signal.
Figure 3:
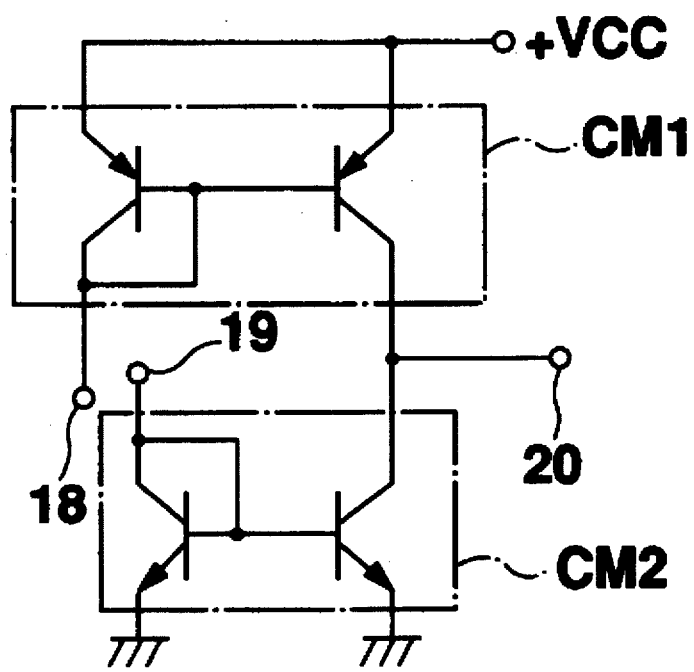
FIG. 3 shows a circuit structure of the final stage of a conventional electric current outputting circuit.
Figure 5:
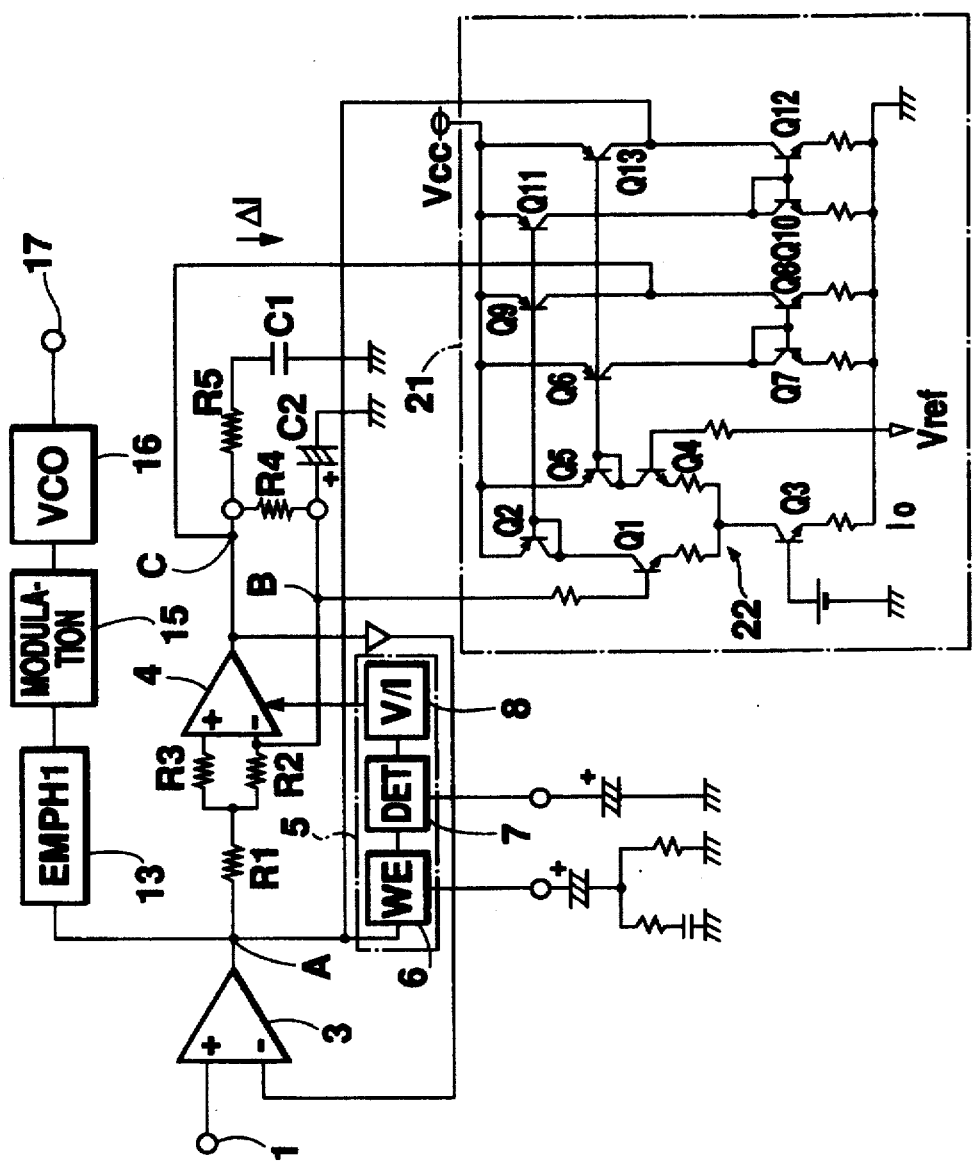
FIG. 5 shows an audio signal recording device according to a first embodiment of the present invention.

FIG. 5 shows a first embodiment of the present invention. The same elements as those in FIG. 2 are given the same reference numerals and their explanations are omitted.

As is indicated in the drawing, this embodiment comprises a comparator 21. The comparator 21 controls the voltages at the output terminal (Point A) of the first operational amplifier 3 and at the output terminal (Point C) of the second operational amplifier 4 in response to the voltage at the inverting terminal (Point B) of the second operational amplifier 4. The voltage at Point B is defined by the output voltage of a smoothing circuit which consists of the resistor R2 and the capacitor C2.

(Construction of the Comparator)

Point B is connected to the base of a transistor Q1. The collector of the transistor Q1 is connected to a power supply via a transistor Q2, and the emitter thereof is grounded via a transistor Q3. The base and collector of the transistor Q2 are short-circuited. The transistor Q3, whose collector is connected to the transistor Q1, receives a predetermined constant voltage V0 at the base, so as to serve as a constant-current power supply. The emitter of the transistor Q3 is grounded. The collector of the transistor Q3 is also connected to the emitter of a transistor Q4. The base of the transistor Q4 receives reference voltage Vref, while the collector thereof is connected to a power supply via a transistor Q5, whose base and collector are short-circuited. The transistors Q1, Q2, Q3, Q4 and Q5 thus together constitute a differential amplifier 22, which compares the voltage at Point B, which is applied to the base of the transistor Q1, and the reference voltage Vref, so that electric current based on the result of the comparison is applied to the transistors Q2 and Q5.

The base of the transistor Q5 is connected to the base of the transistor Q6, whose emitter is connected to the power supply, so that the transistors Q5 and Q6 together constitute a current mirror. The collector of the transistor Q6 is grounded via the transistor Q7, whose collector and base are short-circuited. The base of the transistor Q7 is also connected to the base of the transistor Q8, whose emitter is grounded, so that the transistors Q7 and Q8 together constitute a current mirror. The collector of the transistor Q8 is connected to the power supply via the transistor Q9. The base of the transistor Q9 is connected to the base of the transistor Q2, whose emitter is connected to a power supply as described above, so that the transistors Q2 and Q9 together constitute a current mirror.

The base of the transistor Q2 is also connected to the base of the transistor Q11, so that the transistors Q2 and Q11 together constitute a current mirror. The emitter of the transistor Q11 is connected to the power supply, while the collector thereof is grounded via the transistor Q10, whose collector and bases are short-circuited. The base of the transistor Q10 is also connected to the base of the transistor Q12, so that the transistors Q10 and Q12 together constitute a current mirror. The emitter of the transistor Q12 is grounded, while the collector thereof is connected to the power supply via the transistor 13. The base of the transistor Q13 is connected to the base of the transistor Q5, so that the transistor Q5 and Q13 together constitute a current mirror. The transistors Q8 and Q9 are connected to each other, and that connecting point is further connected to Point C on the output side of the second operational amplifier 4. The transistors Q12 and Q13 are also connected to each other, and that connecting point is further connected to Point B on the output side of the first operational amplifier 3.

In this circuit, the voltages at Points A and B are controlled on the basis of the result of comparison between the voltage at Point B and the reference voltage Vref. Note that the transistors Q1, Q3, Q4, Q7, Q8, Q10 and Q12 are NPN type transistors, while the transistors Q2, Q5, Q6, Q9, Q11, and Q13 are PNP type transistors.

In operation, an audio signal is input via an input terminal 1, and then applied to a non-inverting input terminal of the first operational amplifier 3.

Note that the ALC circuit 2 (see FIG. 2) is omitted in FIG. 5.

The first operational amplifier 3 outputs a signal, which is then applied to the input terminals of the second operational amplifier 4, as well as to a controlling circuit 5. The output of the second operational amplifier 4 is fed back to the first operational amplifier 3.

Here, it is assumed that the second operational amplifier 4 outputs a signal whose direct current (DC) voltage level (offset level) has been increased due to the variations in characteristics of a plurality of elements within the internal circuit of the amplifier 4, and the voltage level at Point C is accordingly increased. In this case, even if the first operational amplifier 3 outputs a signal having zero voltage, the second operational amplifier 4 still outputs some electric current.

The output signal of the second operational amplifier 4 is fed back to the inverting terminal of the first operational amplifier 3, so that the voltage level of the output DC of the first operational amplifier 3 at Point A is resultantly decreased.

When the voltage level of the output DC of the first operational amplifier 3 is decreased, the voltage level of the output DC at Point B is also decreased.

The DC voltage at Point B is compared with the reference voltage Vref by the differential amplifier 22.

The reference voltage Vref is set at a DC voltage level which is desired at the output terminal (Point A) of the first operational amplifier 3. The circuit is constituted such that the voltages at Points A and B become equal to each other.

In the above situation, in which the amplifier 4 outputs a signal with an increased DC voltage, it is necessary to increase the voltage level of the output DC signal of the first operational amplifier 3.

Since the DC voltage at Point B is smaller than the reference voltage Vref, the transistor Q1 is turned off, while the transistor Q4 is turned on. When the transistor Q4 is on, electric current flows to the transistors Q5, Q6, Q7 and Q8, and does not flow to the transistors Q2 and Q9. Then, the transistor Q8 draws electric current from Point C. The drawn electric current corresponds to the electric current which has been delivered from the second operational amplifier 4. As a result of drawing some current from Point C, the voltage level at Point C is reduced.

Meanwhile, transistors Q13 is also turned on, while the transistors Q10, Q11 and Q12 are turned off.

When the transistor Q13 is on, collector current of the transistor Q13 flows, via Point A and resistors R1 and R2, into the capacitor C2 and charges it. While the capacitor C2 is being charged, the DC voltages at Points A and B are increased until both the voltages become equal to the reference voltage Vref.

Note that when the DC voltage at Point C is decreased, the comparator 21 operates contrary to the above so that electric current is drawn from Point A, and fed into Point C.

The comparator 21 operates while the recording operation is carried out so that the voltage at Point A will remain equal to the reference voltage Vref throughout the recording operation. As a result, an audio signal which has a DC voltage at a constant level will be applied to the modulation circuit 15, which eliminates the need of a DC block capacitor.

Embodiment 2

Figure 6:
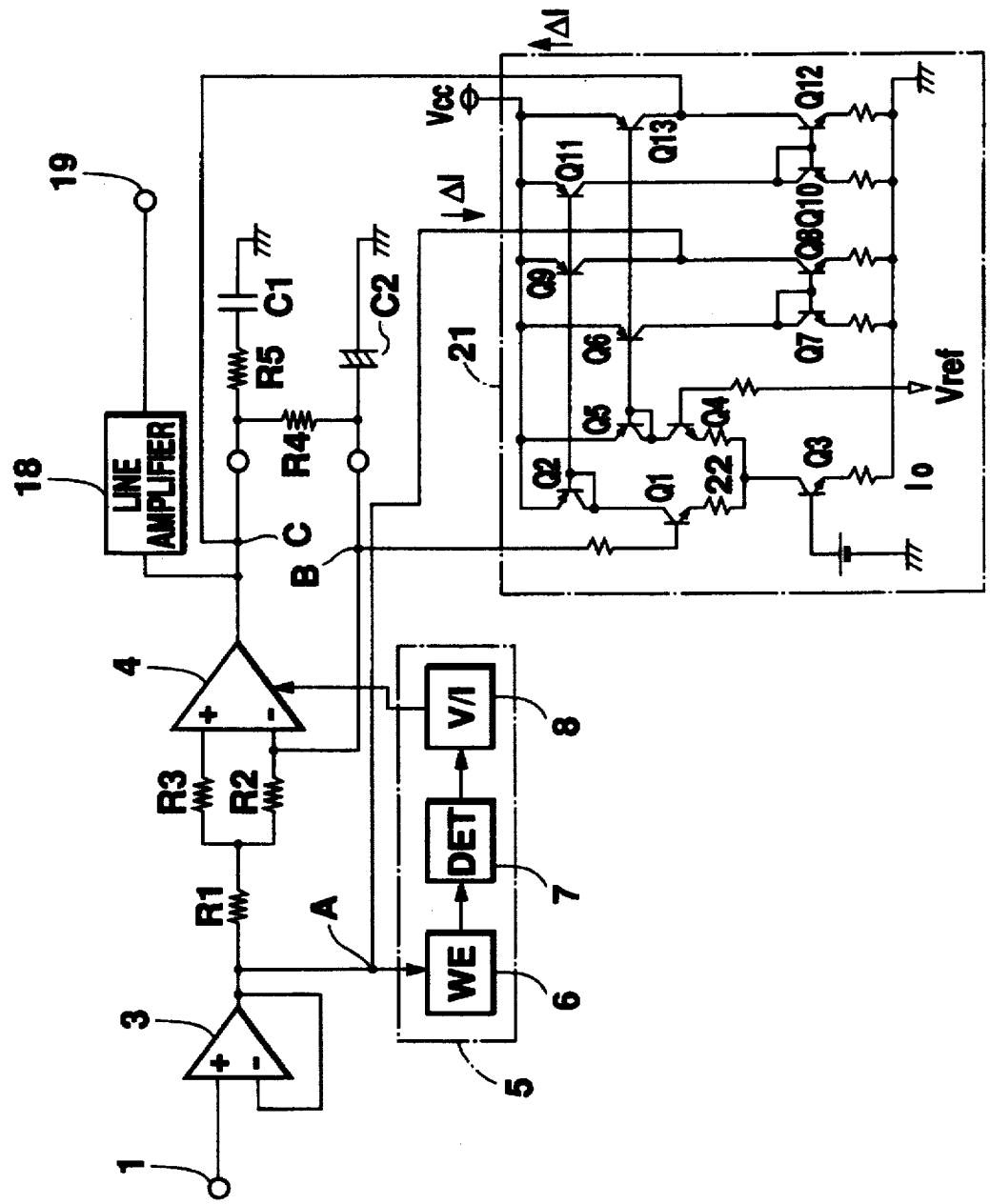
FIG. 6 shows an audio signal recording device according to a second embodiment of the present invention.

FIG. 6 shows a second embodiment of the present invention. The same elements as those in FIGS. 4 and 5 are given the same reference numerals and their explanations are omitted.

Similar to the first embodiment, the second embodiment also comprises a comparator 21. The comparator 21 controls the voltages at the output terminal (Point A) of the first operational amplifier 3 and at the output terminal (Point C) of the second operational amplifier 4 in response to the voltage at the inverting terminal (Point B) of the second operational amplifier 4. The voltage at Point B is defined by the output voltage of a smoothing circuit, which consists of the resistor R4 and the capacitor C2. Note that the relationship between increase/decrease of the voltage at Point B and the direction to drawing and feeding electric current with respect to Points A and C is opposite from the first embodiment.

Figure 4:
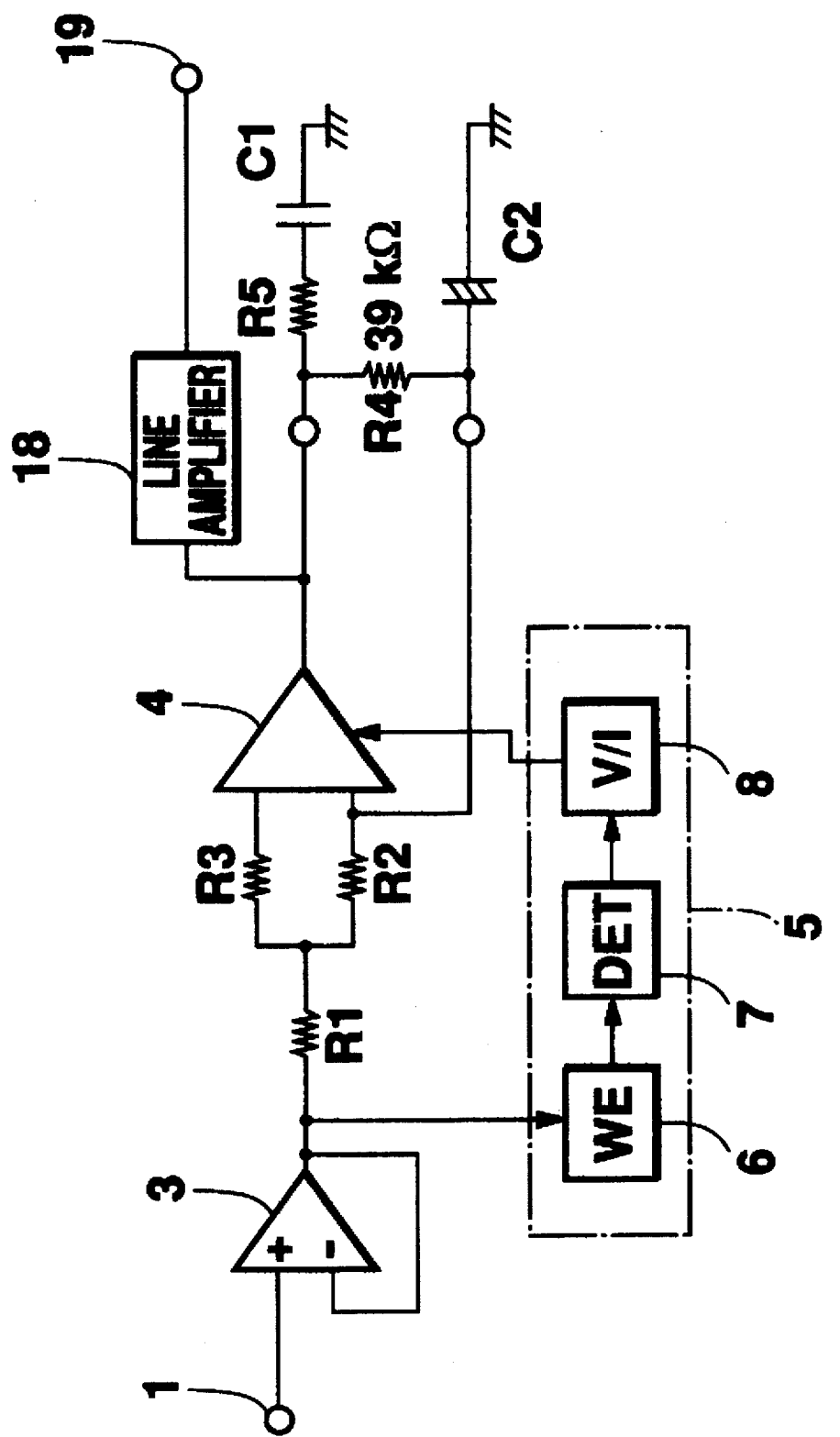
FIG. 4 shows a circuit structure of a conventional signal processing circuit which reproduces an audio signal.

As shown in FIG. 6, similar to the prior art in FIG. 4, the output of the first operational amplifier 3 is short-circuited to the inverting input terminal thereof, and the output of the second operational amplifier 4 is output, via a line amplifier 18, from the output terminal 19.

The comparator 21 in FIG. 6 has the identical construction to that in FIG. 5, in which Point B is connected to the base of the transistor Q1.

Here, being different from FIG. 5, the output terminal (Point A) of the first operational amplifier 3 is connected to the connection point between the transistors Q8 and Q9, while the output terminal of the second operational amplifier 4 is connected to the connection point between the transistor Q12 and Q13.

In operation, an audio signal is input via an input terminal 1, and then applied to a non-inverting terminal of the first operational amplifier 3.

The first operational amplifier 3 outputs a signal, which is then applied to an input terminal of the second operational amplifier 4, as well as to a control circuit 5.

Here, it is assumed that the second operational amplifier 4 outputs a signal whose DC voltage level has been increased due to the variations in characteristics of a plurality of elements within the internal circuit of the amplifier 4, and the voltage level at Point C is accordingly increased. That is, it is assumed that some electric current is delivered to Point C as a result of the offset thereof.

Then, the output current from the operational amplifier 4 flows, via the resistor R4, into the capacitor C2. In this event, since the smoothing circuit 8, which is comprised of the resistor R4 and the capacitor C2, has only a low reactance, as the resistive value of the resistor R4 is equal to 39 KΩ, the voltage at Point B is not increased instantly, but only gradually.

When the smoothing circuit is in a stable (settled) condition, the voltages at Points B and C should be equal to each other. However, although the voltage at Point C is increased, the voltage at Point B cannot immediately follow the increase for the reason described above.

The DC voltage at Point B is compared with the reference voltage Vref by the comparator 22.

The reference voltage Vref is set at a DC voltage level which is desired at the output terminal of the second operational amplifier 4. The circuit is constituted such that the voltages at Points A and B become equal to each other.

In the above situation, in which the amplifier 4 outputs a signal with an increased DC voltage, it is necessary to decrease the DC voltage level of the output signal of the second operational amplifier 4.

When the voltage level at Point B increases gradually until it becomes larger than the reference voltage Vref, the transistor Q1 is turned on while the transistor Q4 is turned off. When the transistor Q1 is on, electric current flows to the transistors Q2 and Q9, but does not flow to the transistors Q5, Q6, Q7 and Q8. Then, the transistor Q9 feeds electric current into Point A. The fed electric current further flows, via Point B, into the capacitor C2.

Meanwhile, the transistor Q13 is also turned off, while the transistors Q10, Q11 and Q12 are turned on.

When the transistor Q12 is on, the collector current of the transistor Q12 attracts the electric charge from Point C, whereby the capacitor C2 is discharged via the resistor R4. When the capacitor C2 is discharged, the DC voltages at Points B and C are decreased until both the voltages become equal to the reference voltage Vref.

The comparator 21 operates while the reproducing operation is carried out so that the voltage at Point C will remain equal to the reference voltage Vref throughout the reproducing operation. As a result, an audio signal which has a constant DC voltage will be applied to the line amplifier 9. Note that when the DC voltage at Point C is decreased, the comparator 21 operates contrary to the above so that the electric current is drawn from Point A, and fed into Point C.

Figure 7:
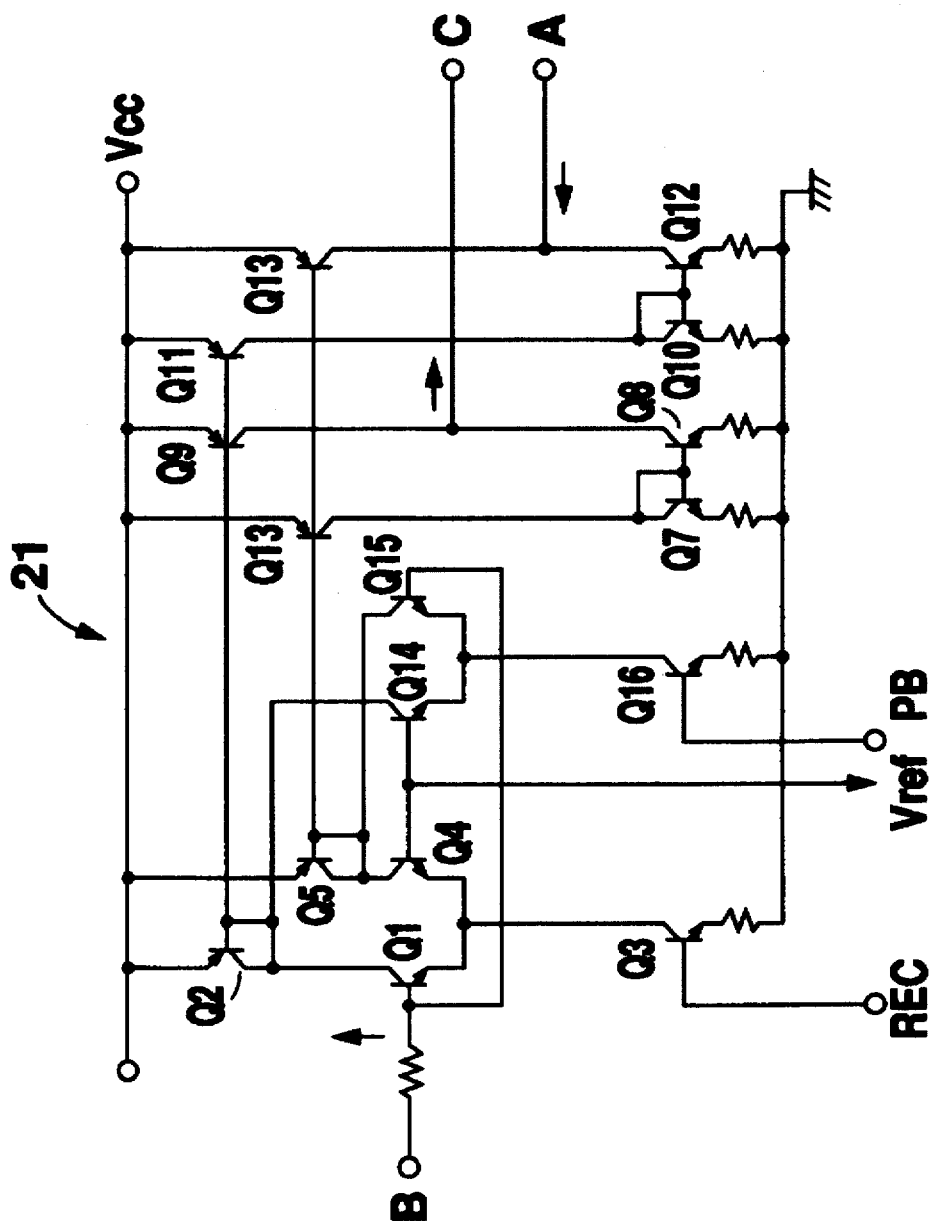
FIG. 7 shows a circuit structure of a comparator which is used for both recording and reproducing operations.

FIG. 7 shows a comparator 21 which can be used for both recording and reproducing operations. In this comparator 21, the collector of the transistor Q2 is connected to the collector of the transistor Q14, whose emitter is grounded via the transistor Q16. The collector of the transistor Q5 is connected to the collector of the transistor Q15, whose emitter is also grounded via the transistor Q16. The base of the transistor Q3 is connected to the recording (REC) terminal so that a constant voltage is supplied to the REC terminal for recording. The base of the transistor Q16 is connected to the playback (PB) terminal so that a constant voltage is supplied to the PB terminal for reproducing. Note that the transistors Q14, Q15, and Q16 are NPN transistors.

With this arrangement, for a recording operation, the transistor Q3 is turned on while the transistor Q16 is turned off. On the other hand, for a reproducing operation, the transistor Q3 is turned off while the transistor Q16 is turned on. Thus, the comparator 21 operates as described in the first embodiment for a recording operation. On the other hand, for a playback operation, the voltage at Point B is applied to the base of the transistor Q15 so as to be compared with the reference voltage Vref, which is applied to the base of the transistor Q14. In this event, because the transistor Q14 controls the electric current flowing in the transistor Q2 and the transistor Q15 controls the electric current flowing in the transistor Q5, the electric currents flowing into the transistors Q2 and Q5 show a reversed characteristic from those for a recording operation. Accordingly, the electric currents flowing into the transistors Q9 and Q13 show a reversed characteristic between recording and reproducing operations. With this arrangement, the comparator 21 can be used for both recording and playback operations while the connection point between the transistors Q8 and Q9 and that between the transistors Q12 and Q13 remain connected to Points A and C, respectively, by applying a Voltage to the REC terminal and leaving the PB terminal open for recording, and vice versa for reproducing.

Further, if the comparator 21 is constituted such that the output either from the first or second operational amplifier can be selectively supplied to the inverting terminal of the first operation amplifier depending on a recording or a reproducing operation, the entire circuit can be used for both recording and reproducing operations. It is also necessary to constitute the circuit such that an output of the circuit can be transmitted selectively from the emphasis circuit 13 or from a line amplifier 18.

What is claimed is:

1. An audio signal recording device for compressing an audio signal, comprising:

a first operational amplifier capable of receiving an audio signal at a non-inverting input terminal and a feedback signal at an inverting input terminal so as to output a compressed signal in response to a difference between the audio signal and the feedback signal;

a second operational amplifier capable of amplifying the compressed signal output from said first operational amplifier by a variable amplification rate so as to transmit a feedback signal to the inverting terminal of said first operational amplifier, the feedback signal being constituted of an amplified signal based on the compressed signal;

a control circuit capable of controlling an amplification rate of said second operational amplifier in response to a signal level of the compressed signal output from said first operational amplifier; and a DC control circuit capable of adjusting a DC level of the compressed signal output from said first operational amplifier to be equal to a predetermined reference voltage.

2. An audio signal recording device as defined in claim 1, wherein said second operational amplifier comprises an electric current controlled amplifier.

3. An audio signal recording device as defined in claim 2, wherein said DC control circuit adjusts a smoothing voltage to be equal to a reference voltage, the smoothing voltage being obtained by smoothing an input signal of said second operational amplifier.

4. An audio signal recording device as defined in claim 3, wherein said DC control circuit includes a comparator for comparing said smoothing voltage and said reference voltage so as to output a result of comparison.

5. An audio signal recording device as defined in claim 4, wherein said comparator supplies electric current to output sides of said first and second operational amplifiers in response to the result of comparison, thereby controlling voltages at the output sides of said first and second operational amplifiers.

6. An audio signal recording device as defined in claim 5, wherein said comparator draws electric current from the output side of said first operational amplifier, and feeds electric current to the output side of said second operational amplifier when said smoothing voltage is larger than said reference voltage, whereby a DC voltage on the output side of said first operational amplifier is adjusted to be equal to said reference voltage.

7. An audio signal reproducing device for expanding an audio signal, comprising:

a first operational amplifier capable of receiving an audio signal and a feedback signal at an inverting input terminal, the feedback signal being constituted of output signal thereof;

a second operational amplifier capable of amplifying an signal output from said first operational amplifier by a variable amplification rate so as to output as amplified signal as an expanded signal;

a control circuit capable of controlling the amplification rate of said second operational amplifier in response to a signal level of the signal output from said first operational amplifier; and a DC control circuit capable of adjusting a DC level of the expanded signal output from said second operational amplifier to be equal to a given reference voltage.

8. An audio signal recording device as defined in claim 7, wherein said second operational amplifier comprises an electric current controlled amplifier.

9. An audio signal recording device as defined in claim 8, wherein said DC control circuit adjusts a smoothing voltage to be equal to a reference voltage, the smoothing voltage being obtained by smoothing an input signal of said second operational amplifier.

10. An audio signal recording device as defined in claim 9, wherein said DC control circuit includes a comparator for comparing said smoothing voltage and said reference voltage so as to output a result of comparison.

11. An audio signal recording device as defined in claim 10, wherein said comparator supplies electric current to output sides of said first and second operational amplifiers in response to the result of comparison, thereby controlling voltages on output sides of said first and second operational amplifier.

12. An audio signal recording device as defined in claim 11, wherein said comparator feeds electric current to the output side of said first operational amplifier, and draws electric current from the output side of said second operational amplifier when said smoothing voltage is larger than said reference voltage, whereby a DC voltage on the output side of said second operational amplifier is adjusted to be equal to said reference voltage.

* * * * *